United States Patent
Heron et al.

(10) Patent No.: US 10,690,719 B2
(45) Date of Patent: Jun. 23, 2020

(54) SYSTEM AND METHOD FOR TESTING AN INTEGRATED CIRCUIT

(71) Applicant: COMMISSARIAT A L'ENERGIE ATOMIQUE ET AUX ENERGIES ALTERNATIVES, Paris (FR)

(72) Inventors: Olivier Heron, Rochefort-en-Yvelines (FR); Boukary Ouattara, Viry-Chatillon (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 102 days.

(21) Appl. No.: 16/092,747

(22) PCT Filed: Apr. 3, 2017

(86) PCT No.: PCT/EP2017/057801
§ 371 (c)(1),
(2) Date: Oct. 10, 2018

(87) PCT Pub. No.: WO2017/178258
PCT Pub. Date: Oct. 19, 2017

(65) Prior Publication Data
US 2019/0128961 A1    May 2, 2019

(30) Foreign Application Priority Data

Apr. 12, 2016 (FR) ...................... 16 53214

(51) Int. Cl.
*G01R 31/317* (2006.01)
*G01R 31/30* (2006.01)
*G01R 31/28* (2006.01)

(52) U.S. Cl.
CPC ....... *G01R 31/31725* (2013.01); *G01R 31/30* (2013.01); *G01R 31/2884* (2013.01)

(58) Field of Classification Search
CPC ........ G01R 21/133; G01R 27/14; G06F 13/20
(Continued)

(56) References Cited

U.S. PATENT DOCUMENTS

| 6,216,099 B1 | 4/2001 | Fang et al. | |
| 2008/0062022 A1* | 3/2008 | Melanson | H03M 3/464 341/143 |

(Continued)

OTHER PUBLICATIONS

Kinniment, et al., "On-chip structures for timing measurement and test", Microprocessors and Microsystems, vol. 27, Issue 9, pp. 473-483, Oct. 1, 2003.

*Primary Examiner* — Giovanni Astacio-Oquendo
(74) *Attorney, Agent, or Firm* — Baker & Hostetler LLP

(57) ABSTRACT

A system for testing an application-specific integrated circuit, includes a characterization integrated circuit comprising at least two configurable test structures and a test assembly comprising: a device for controlling the characterization integrated circuit, configured to vary at least one physical parameter of at least one configurable test structure, an interface for receiving at least one description of an application-specific integrated circuit and extracting at least one path, a configuration device for activating and interconnecting at least one subset of the logic cells of at least one degraded test structure and of at least one non-degraded test structure, so that they each produce a topology identical to a portion of an extracted path, a measurement control device for performing at least one first measurement of a physical variable on the degraded test structure and at least one second measurement, identical to the first measurement, on the non-degraded test structure.

18 Claims, 6 Drawing Sheets

(58) Field of Classification Search
USPC ....... 324/760.02, 76.11, 76.61, 76.69, 76.74, 324/103 R
See application file for complete search history.

(56) References Cited

U.S. PATENT DOCUMENTS

| | | | |
|---|---|---|---|
| 2008/0079444 A1* | 4/2008 | Denison | G01D 5/24 324/679 |
| 2009/0027990 A1 | 1/2009 | Houston | |
| 2009/0204350 A1* | 8/2009 | Govil | B81C 99/0045 702/65 |
| 2012/0245879 A1 | 9/2012 | Mikkola | |
| 2014/0123085 A1 | 5/2014 | Shroff et al. | |

* cited by examiner

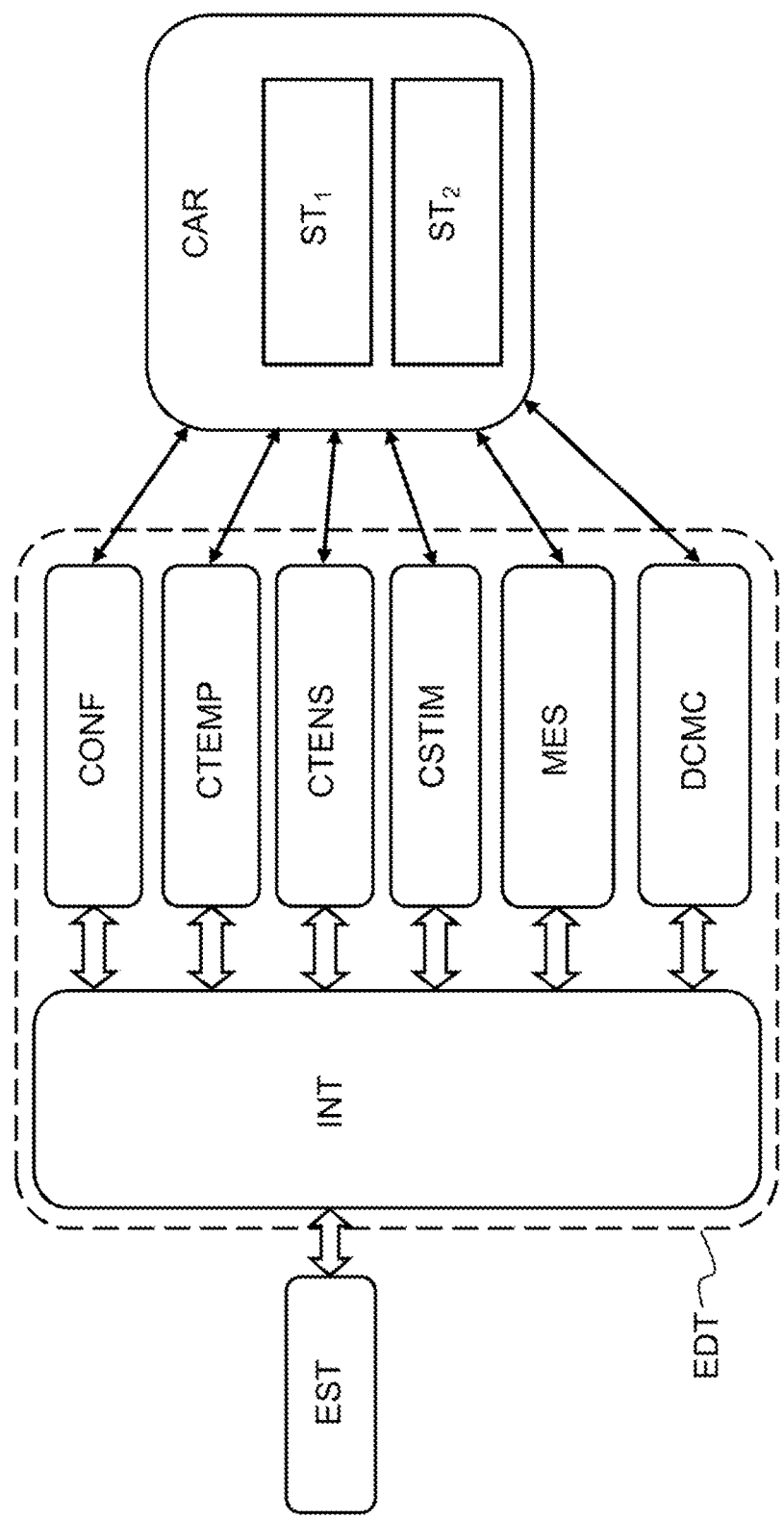

SYSTEM AND METHOD FOR TESTING AN INTEGRATED CIRCUIT

CROSS-REFERENCE TO RELATED APPLICATIONS

This application is a National Stage of International patent application PCT/EP/2017/057801, filed on Apr. 3, 2017, which claims priority to foreign French patent application No. FR 1653214, filed on Apr. 12, 2016, the disclosures of which are incorporated by reference in their entirety.

FIELD OF THE INVENTION

The present invention generally relates to integrated circuits, and in particular to a system and a method for testing an integrated circuit.

BACKGROUND

Manufacturing electronic components requires extremely complex methods. Furthermore, manufacturing such components requires a complex and expensive infrastructure, such as foundry plants for manufacturing the integrated circuits of these electronic components from silicon and based on masks.

The miniaturization of transistors in the method for manufacturing the integrated circuits has made it possible to produce integrated circuits that are faster, less energy-consuming and less costly for one and the same function. However, this technique reduces the reliability of the transistors and, de facto, the overall reliability of the integrated circuit.

The reliability of integrated circuits may vary depending on the technology that is used. For example, the function performed by the integrated circuit with 28 nm manufacturing technology may fail earlier during use thereof than with 40 nm technology or another more obsolete technology (65 nm for example). Moreover, the lifetime of electronic products has a tendency to diminish as miniaturization progresses. This tendency is a major obstacle for embedded electronic systems, for example in the field of the motor vehicle industry, the avionics industry or else the defense industry. Such embedded systems are not able to benefit from the advantages of miniaturization to improve their performance, which may limit competitiveness in such fields. Specifically, the reliability level of integrated circuits on thin technologies (for example 28 nm) is below the requirements stipulated by certification authorities and modern standards.

The reduction in the reliability of the integrated circuits is due to the combination of physical phenomena and chemical phenomena that occur in the transistors of the integrated circuits. Such phenomena lead to a variation in the electrical parameters, which has a tendency to reduce the switching speed of each transistor. This slowing is reflected in the delayed propagation of the information signals, which may ultimately result in the information bits being altered. Such an alteration may cause failure of the integrated circuit: the integrated circuit then no longer correctly performs the desired function (for example malfunctioning of the braking operation of a vehicle).

The occurrence of these physical and chemical phenomena in the transistors depends on several variables: the geometry, the materials used, the design of the pattern, the supply voltage and the junction temperature of the transistor, the sequence and the alternating frequency of the bits (between a bit of value 0 and a bit of value 1) that pass through the transistor. The overall reliability of the integrated circuit also depends on the way in which the transistors are interconnected.

The reliability problem with the transistors is generally addressed by the semiconductor manufacturer of the integrated circuit. However, the reliability problem is nowadays a major constraint in the design phase of integrated circuits. In the known approaches, the designer uses software tools that are capable of providing a preliminary indication as to the reliability level of the integrated circuit, before manufacture thereof. However, such tools require the use of a database that contains technological constants. These technological constants are dependent on the geometry, on the materials used, on the design of the pattern, on the supply voltage and on the temperature of the transistor. They are essential for obtaining an accurate estimation of the reliability level.

The content of these databases is generally obtained empirically by the manufacturer using internal testing means. Such a database is not available to all semiconductor manufacturers. Moreover, this information is confidential in nature, such that access thereto is greatly limited (access under license, access limited to third parties who outsource the manufacture of only their IC, etc.).

Furthermore, the database is not complete, as constructing it requires a very lengthy process of characterizing each type of transistor. Generally, the manufacturer constructs this base for a few typical cases. However, integrated circuit designers need to know the impact of a design choice—for example an IP processor X rather than a processor Y—on the risks of the integrated circuit being developed, regardless of the technology used.

Besides the influence of the design choices, the risks to the integrated circuit are also influenced by the mission profile contemplated by the end user of the IC. The mission profile represents the intended operating conditions of the integrated circuit during use thereof in the end system. A mission profile is notably characterized by the following parameters: the operating period during which the integrated circuit is powered, the supply voltage of the integrated circuit, the internal temperature of the integrated circuit and the manufacturing technology for the integrated circuit.

To date, there are no design solutions outside of manufacturing plants that allow the designer internally and accurately to analyze the impact of a technology on the overall reliability of his application-specific integrated circuit.

Patent application US2012/0245879A1 describes a programmable test bench for characterizing a process for manufacturing an integrated circuit, and notably the electrical properties of a transistor. This test chip may be used before an integrated circuit is manufactured by a design engineer. The test bench includes a test slice of semiconductor material (a die) that contains devices under test (DUT) of transistor type and embedded test and measurement electronics. This reference integrated circuit is designed, manufactured and sold by the provider of the test bench. The test bench may be configured by a user to launch the characterization and recover the measurement results. The results are stored in the form of a file in the machine. This solution makes it possible to characterize the variations in and the reliability of the process for manufacturing the circuit for various mission profiles. However, this solution requires reliability expertise to configure the test bench, whereas design engineers do not generally have such expertise. Moreover, this solution does not make it possible to directly estimate the impact of a design choice for the integrated circuit on the reliability thereof. Specifically, the measurement outputs of the test bench are not able to be exploited so as to make such an estimation.

There is therefore a need for a system and a method for testing an integrated circuit in the design phase.

SUMMARY OF THE INVENTION

The invention proposes a system and a method for testing an integrated circuit that allows estimation of the variation over time, due to aging, in certain physical variables of an internal circuit. For example, the estimated physical variable may be an internal propagation time or a current consumed by the circuit.

The effect of the aging is simulated according to a given mission profile by a design engineer, this being done without knowledge a priori of the physics of the aging and of the technological parameters linked to the manufacturing method.

The mission profile represents the operating conditions of the integrated circuit during use thereof. A mission profile is notably defined by four parameters: the operating period during which the circuit is powered, the supply voltage of the circuit, the internal temperature of the circuit and the manufacturing technology for the circuit.

The invention makes it possible to estimate the variation over time in physical parameters or variables of an integrated circuit on the basis of its description, without requiring any particular expertise to define the characterization protocol to be applied to the test system.

The invention is based on a test system on a hardware medium comprising firstly test equipment and secondly a characterization integrated circuit dedicated to the tests. The specification of the characterization integrated circuit is independent of that of the application-specific integrated circuit to be produced.

The invention is also based on a test method that uses the test system and in particular the content of the characterization integrated circuit to estimate the variation in a characteristic physical variable of the application-specific integrated circuit from the first steps of the design phase.

One subject of the invention is thus a system for testing an application-specific integrated circuit represented by a description comprising a set of paths linking a plurality of logic cells, the test system comprising a characterization integrated circuit comprising at least two configurable test structures each comprising a plurality of activatable logic cells and a plurality of connectors for activating and interconnecting the logic cells, and a test assembly comprising:
- a device for controlling the characterization integrated circuit, configured to vary at least one physical parameter of at least one configurable test structure so as to accelerate its aging so as to obtain at least one degraded test structure,
- an interface for receiving at least one description of an application-specific integrated circuit and extracting at least one path from the description,
- a device for configuring the characterization integrated circuit so as to activate and interconnect at least one subset of the logic cells of at least one degraded test structure and of at least one non-degraded test structure, so that they each produce a topology identical to at least one portion of an extracted path,
- a measurement control device for performing at least one first measurement of a physical variable on said at least one degraded test structure and at least one second measurement, identical to the first measurement, on said at least one non-degraded test structure.

According to one particular variant of the invention, each test structure comprises combinatorial logic cells and memory logic cells.

According to one particular variant of the invention, the device for controlling the characterization integrated circuit comprises a device for controlling the temperature of at least one test structure.

According to one particular variant of the invention, the device for controlling the characterization integrated circuit comprises a generator of stimuli that are intended to be injected at an input point of at least one test structure.

According to one particular variant of the invention, the device for controlling the characterization integrated circuit comprises a device for controlling the supply voltage of at least one test structure.

According to one particular variant, the system according to the invention furthermore comprises an estimation device configured to determine, from the measurements supplied by the measurement device, an estimation of a variation over time in at least one physical variable of the application-specific integrated circuit.

According to one particular variant of the invention, the physical variable is a propagation time and the measurement control device is able to measure a propagation time of a signal between two memory logic cells.

According to one particular variant of the invention, the physical variable is a current that is consumed and the characterization integrated circuit furthermore comprises, for each test structure, a device for measuring the current consumed in the test structure that is able to interact with the measurement control device.

Another subject of the invention is a method for testing an application-specific integrated circuit represented by a description comprising a set of paths linking a plurality of logic cells, the method being implemented by way of a test system comprising a characterization integrated circuit comprising at least two configurable test structures each comprising a plurality of activatable logic cells and a plurality of connectors for activating and interconnecting the logic cells and a test assembly, the method comprising the steps of:
- varying at least one physical parameter of at least one configurable test structure so as to accelerate its aging so as to obtain at least one degraded test structure,
- receiving a description of an application-specific integrated circuit and extracting at least one path from the description,
- activating and interconnecting at least one subset of the logic cells of at least one degraded test structure and of at least one non-degraded test structure, so that they each produce a topology identical to at least one portion of an extracted path,
- performing at least one first measurement of a physical variable on said at least one degraded test structure and at least one second measurement, identical to the first measurement, on said at least one non-degraded test structure.

According to one particular aspect of the method according to the invention, the portion of the path extracted from the description of the application-specific integrated circuit comprises at least three logic cells connected in series.

According to one particular aspect of the method according to the invention, said subset of activated and interconnected logic cells furthermore comprises:

An additional memory logic cell connected upstream of the three extracted logic cells if the first logic cell of the portion of the extracted path is not a memory logic cell, An additional memory logic cell connected downstream of the three extracted logic cells if the last logic cell of the portion of the extracted path is not a memory logic cell.

According to one particular aspect of the method according to the invention, at least one physical variable is measured at least on a memory logic cell of said subset.

According to one particular aspect of the method according to the invention, the method is iterated by varying the portion of the extracted path using a sliding window to cover the entire path.

According to one particular aspect of the method according to the invention, said physical parameter is selected from among a temperature of the circuit, a supply voltage, and a stimulus injected at the input of the circuit of variable nature and duration.

According to one particular variant, the method according to the invention furthermore comprises estimating a variation over time in at least one physical variable of the application-specific integrated circuit from the measurements performed on said at least one degraded test structure and on said at least one non-degraded test structure.

According to one particular variant, the estimation comprises calculating the difference between two identical measurements performed on said at least one degraded test structure and on said at least one non-degraded test structure.

According to one particular variant, the estimation comprises calculating a ratio between a sum of the differences between two identical measurements performed on said at least one degraded test structure and on said at least one non-degraded test structure and a sum of the measurements performed on said at least one non-degraded test structure.

According to one particular aspect of the method according to the invention, the physical variable is a propagation time or a current that is consumed.

BRIEF DESCRIPTION OF THE DRAWINGS

Other features and advantages of the present invention will become more clearly apparent upon reading the following description with reference to the appended drawings, in which:

FIG. 9 shows a diagram of a system for testing an integrated circuit according to one variant of the invention applied to the estimation of the variation in the current consumed in the circuit.

DETAILED DESCRIPTION

Figure 1:
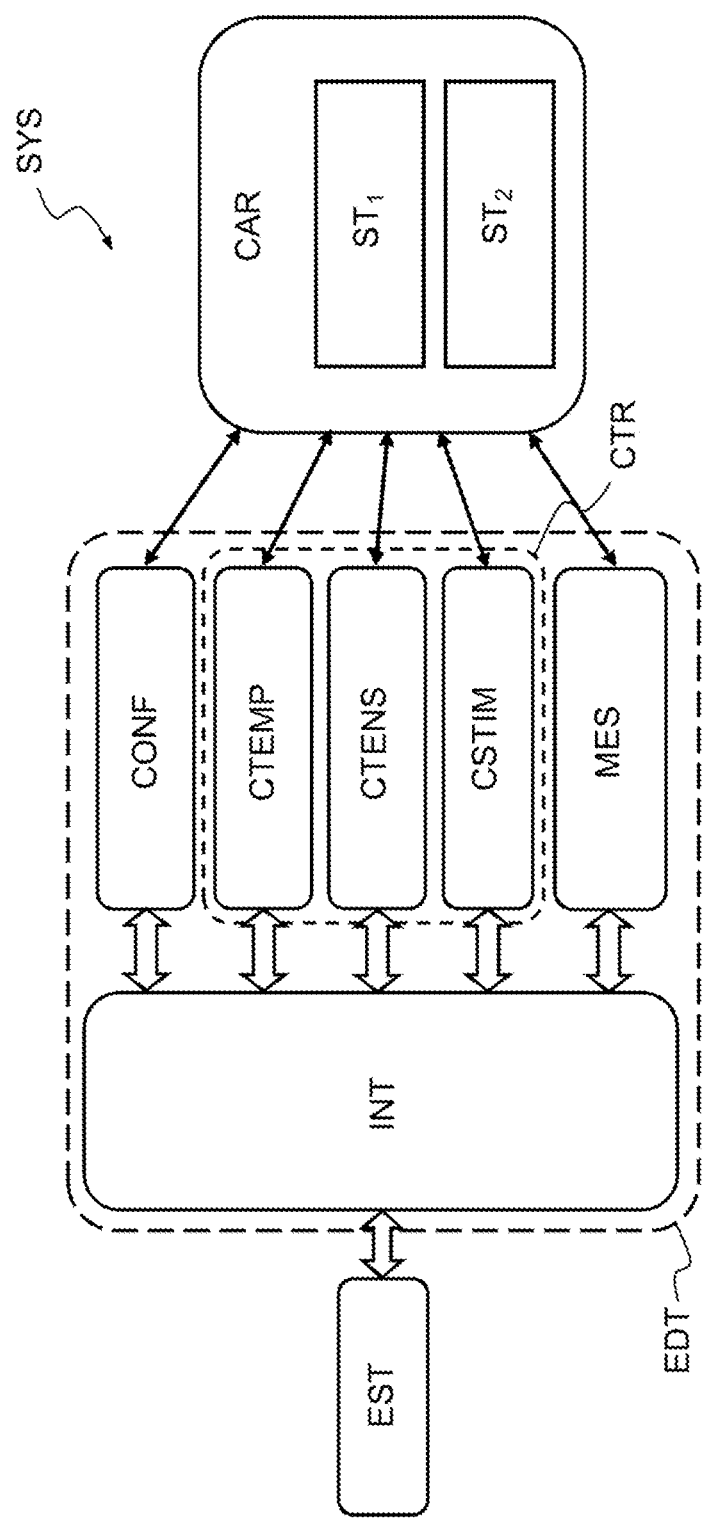
FIG. 1 shows an overview of a system for testing an integrated circuit according to the invention.

FIG. 1 shows an overview of a test system SYS according to the invention, which primarily comprises a characterization circuit CAR and a test assembly EDT. The test system is furthermore connected to an estimation device EST via a communication link, which may be a wired link, a wireless link or a communication network, for example the Internet. In one embodiment of the invention, the estimation device EST may be integrated into the test system SYS. In another embodiment of the invention, the estimation device EST may be remote from the test system SYS.

The characterization circuit CAR comprises a plurality of test structures ST1, ST2. In particular, the number of test structures implemented in a characterization circuit must be enough to take account of the effects of the variability of the manufacturing method.

The characterization circuit CAR may be manufactured using any manufacturing technology associated with a semiconductor manufacturer. One exemplary manufacturing technology is what is known as 'bulk 40 nm low-power' technology.

The manufacturing technology defines a library of standard logic cells. Each cell defines a function, for example a logic gate of AND, OR or NAND type, or else an inverter or a flip-flop or any other logic function. These logic cells may be combined with one another by design assistance tools.

The logic cells are primarily of two types. Combinatorial logic cells perform logic functions, for example Boolean logic functions, while memory logic cells perform memory functions of flip-flop and latch type.

Each test structure ST1, ST2 comprises a plurality of logic cells defined in accordance with the chosen manufacturing technology and a plurality of means for activating and interconnecting these cells with one another. One example of such a means is a switch. A characterization circuit comprises at least two identical test structures. Each test structure is able to be configured so as to activate and interconnect certain logic cells. A test structure is configured by driving the activation and interconnection means.

The test system according to the invention also comprises a test assembly that comprises at least a device CONF for configuring the characterization integrated circuit CAR, a device CTR for controlling the characterization integrated circuit CAR, a measurement device MES for measuring a physical variable internal to the characterization integrated circuit CAR and an interface INT (or controller) for exchanging information between the estimation device EST and the test assembly EDT.

The configuration device CONF is used to configure each test structure on the basis of description elements of the application-specific integrated circuit to be designed.

The control device CTR is used to vary at least one physical parameter of at least one test structure so as to bring about accelerated aging of the components of this test structure.

The control device CTR may comprise a device CTEMP for controlling the temperature, for example a heater associated with a temperature sensor. It may also comprise a stimulus generator GSTIM for generating and injecting a signal of a given form for a given duration at the input of a test structure. It may also comprise a device CTENS for controlling the supply voltage of the test structure.

Various variant embodiments of the test system SYS are possible.

In a first variant, the test assembly EDT may be integrated directly into the characterization integrated circuit CAR.

In a second variant, the test assembly EDT may be implanted on an electronic board that also contains the characterization integrated circuit CAR.

In these two first variants, the characterization integrated circuit may be encapsulated.

In a third variant, the test assembly EDT is separate from the characterization integrated circuit CAR.

The two first variants have the advantage of providing a compact integrated device that does not require separate test equipment. The second variant also has the advantage of being less complex to implement than the first variant.

The third variant has the advantage of allowing accurate measurements on the characterization integrated circuit without having to make an effort to design and integrate the test assembly in a chip or an electronic board.

The estimation device EST may be implemented by software means, for example in the form of client software intended for the design engineer. The client software may connect to the test system SYS remotely via a remote server to which the system is linked.

Figure 2:
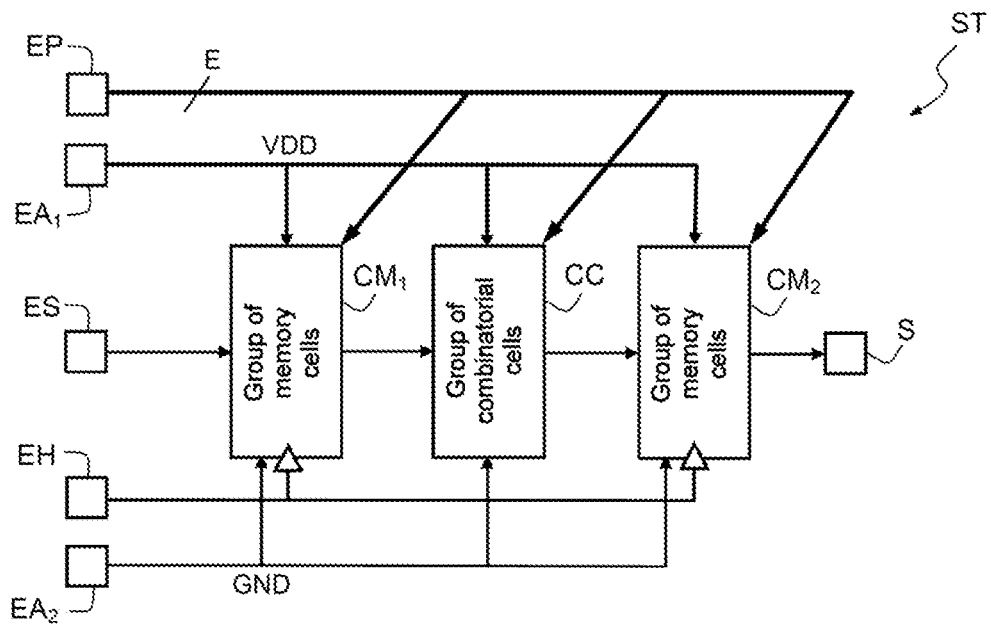
FIG. 2 shows a diagram of a test structure according to the invention.

FIG. 2 shows a diagram of a test structure ST according to the invention.

A test structure comprises a plurality of logic cells and a plurality of activation and interconnection means. One possible exemplary activation and interconnection means is a switch. The remainder of the description is given with consideration to this example, it being understood that the invention is not limited to this particular embodiment case. An electronic switch may be produced for example using what is known as 'pass gate' technology.

However, the invention is not limited to the use of switches to perform the function of activating and interconnecting the cells, this function being able to be performed by other components.

A logic cell has an output and at least one input onto which an information signal conveying a binary message is able to be injected. A logic cell also has two power supply contacts.

A test structure comprises at least two groups of memory cells CM1, CM2 and a group of combinatorial cells CC, as shown in FIG. 2.

Each group of cells contains at least one cell and at least one switch.

The test structure ST also comprises a plurality of programming inputs EP for configuring the layout of the logic cells, at least two power supply inputs EA1, EA2, a clock input EH, a signal input ES and a signal output S.

The programming inputs are used to activate certain switches so as to configure a particular layout of cells connected in series.

According to one particular embodiment, the activation and interconnection means may comprise two switches for each cell. A first switch is used to command the activation of a cell. To this end, it may be connected between the power supply terminal of a cell and a power supply terminal EA1 of the test structure. A second switch is used to command the connection of one cell to another.

Each programming input EP may command a switch. Advantageously, an address decoder makes it possible to reduce the number of programming inputs and thus to reduce the number of terminals to be provided on the characterization integrated circuit.

The signal input ES and output S are used respectively to inject and measure a test stimulus or signal in the cells that are connected to one another beforehand by way of the switches and on the basis of the configuration transmitted via the programming inputs EP.

Configuring a test structure notably involves:
  activating a memory cell from among the cells available in a first group of memory cells CM1,
  activating at least one combinatorial logic cell from among those present in the group of combinatorial cells CC,
  activating a memory cell from among the cells available in the second group of memory cells CM2,
  connecting the activated cells to the signal input terminal ES and output terminal S.

Figure 3:
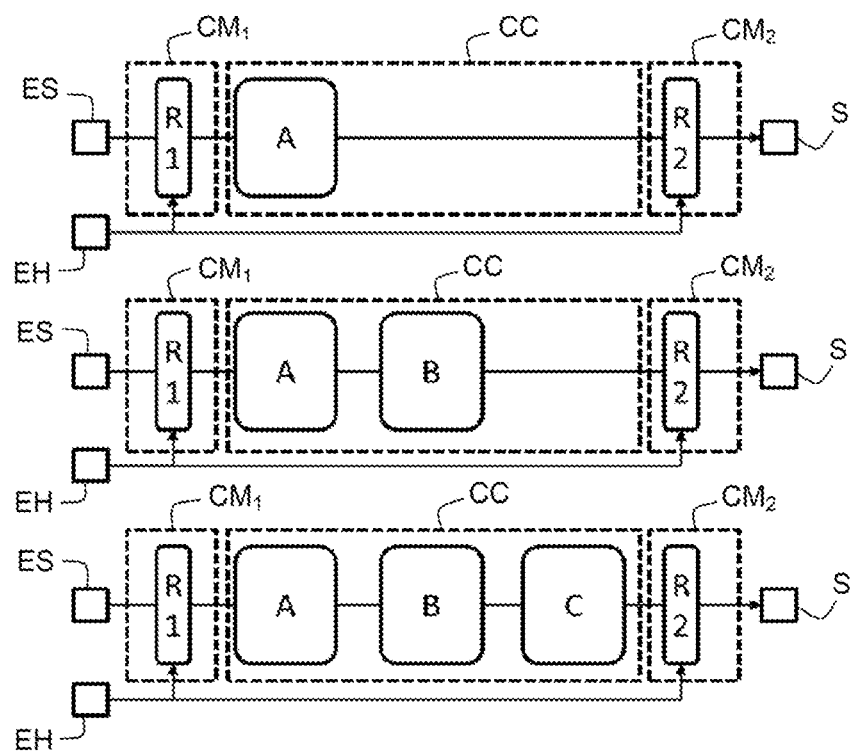
FIG. 3 shows a diagram illustrating several possible layouts of cells in a test structure according to a first mode of operation.

FIG. 3 shows, in one and the same diagram, three exemplary layouts, in series, of a plurality of logic cells.

In the three examples shown in FIG. 3, each group of memory cells CM1, CM2 each comprises a memory cell R1, R2.

The group of combinatorial cells CC comprises between one and three combinatorial cells A, B, C connected in series.

These particular layouts are used in one embodiment of the test method according to the invention, which will be described in detail further on in the text.

Figure 4:
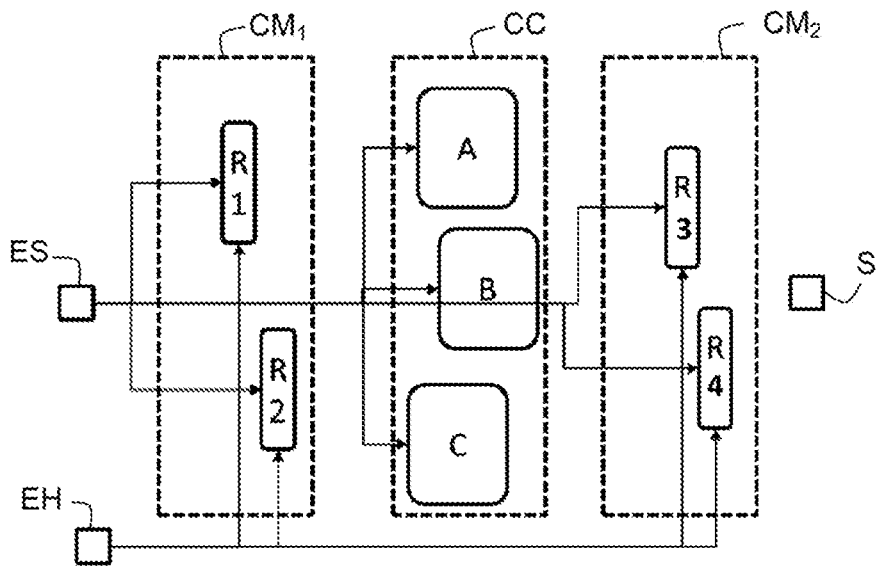
FIG. 4 shows a diagram illustrating several possible layouts of cells in a test structure according to a second mode of operation.

FIG. 4 shows another exemplary layout, in parallel, of a plurality of logic cells.

In this example, the first group of memory cells CM1 comprises two memory cells R1, R2 connected in parallel to the signal input ES.

The second group of memory cells CM2 comprises two memory cells R3, R4 connected in parallel to the signal input ES.

The group of combinatorial cells CC comprises three combinatorial cells A, B, C connected in parallel to the signal input ES.

In this layout, all of the cells are connected in parallel to the signal input ES. The other possible inputs of the cells are forced to a fixed value '0' or '1'. The outputs of the cells are not connected. The power supply contacts of the cells are connected to the same power supply terminal.

The particular layout of FIG. 4 is utilized in one particular step of the test method according to the invention.

Figure 5:
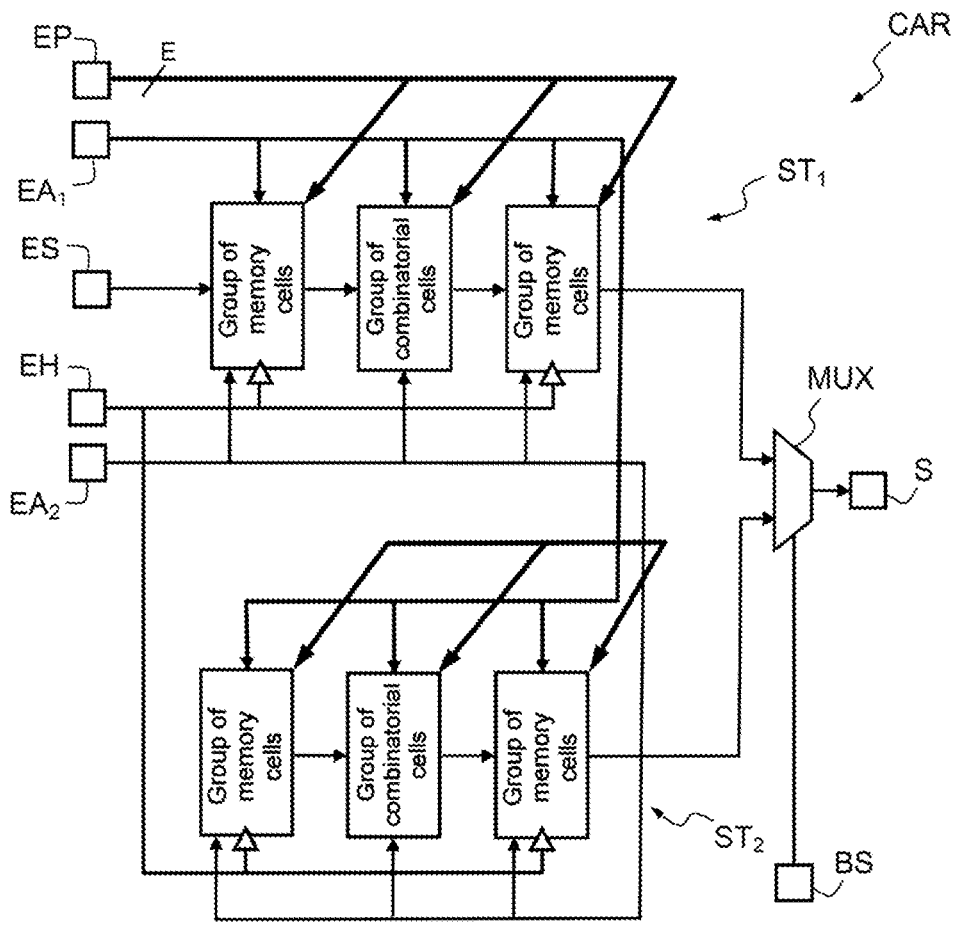
FIG. 5 shows a diagram illustrating one possible layout of two test structures within a characterization circuit.

FIG. 5 shows an assembly of two test structures arranged within a characterization integrated circuit.

According to a first variant embodiment described in FIG. 5, the two test structures ST1, ST2 share the same input and output terminals of the characterization integrated circuit. The number of test structures thus connected in parallel may be greater than two.

The outputs of the test structures are linked to a multiplexer MUX associated with a selection terminal that controls the connection of the output of one of the test structures to the output of the characterization integrated circuit.

Thus, the test structures ST1, ST2 may simultaneously receive the same configuration on the programming inputs and the same signals on the signal input.

According to a second variant embodiment, not shown in FIG. 5, the inputs and outputs of the test structures are physically separate from one another, in other words they are connected to separate terminals of the characterization integrated circuit.

The two abovementioned variants may also be combined in one and the same characterization integrated circuit.

According to one particular mode of the invention, the test structures may include heating devices for increasing the junction temperature of the transistors of the logic cells, and also temperature sensors. The heating devices and sensors are then linked to the temperature control device CTEMP of the test assembly EDT.

A characterization integrated circuit may comprise one or more pairs of test structures. The number of test structures depends on the production cost and on the manufacturing yield.

A plurality of characterization integrated circuits may be produced using various manufacturing technologies. The specification of the characterization integrated circuit developed for a first technology may be reused to address another technology.

The invention may be based on the use of a single test chip comprising a test system. Advantageously, the invention may also use a plurality of identical chips starting from different positions of one and the same wafer and/or various wafers. After manufacture, the characterization integrated circuits are tested for manufacturing defects. Only those chips without defects are retained.

Figure 6:
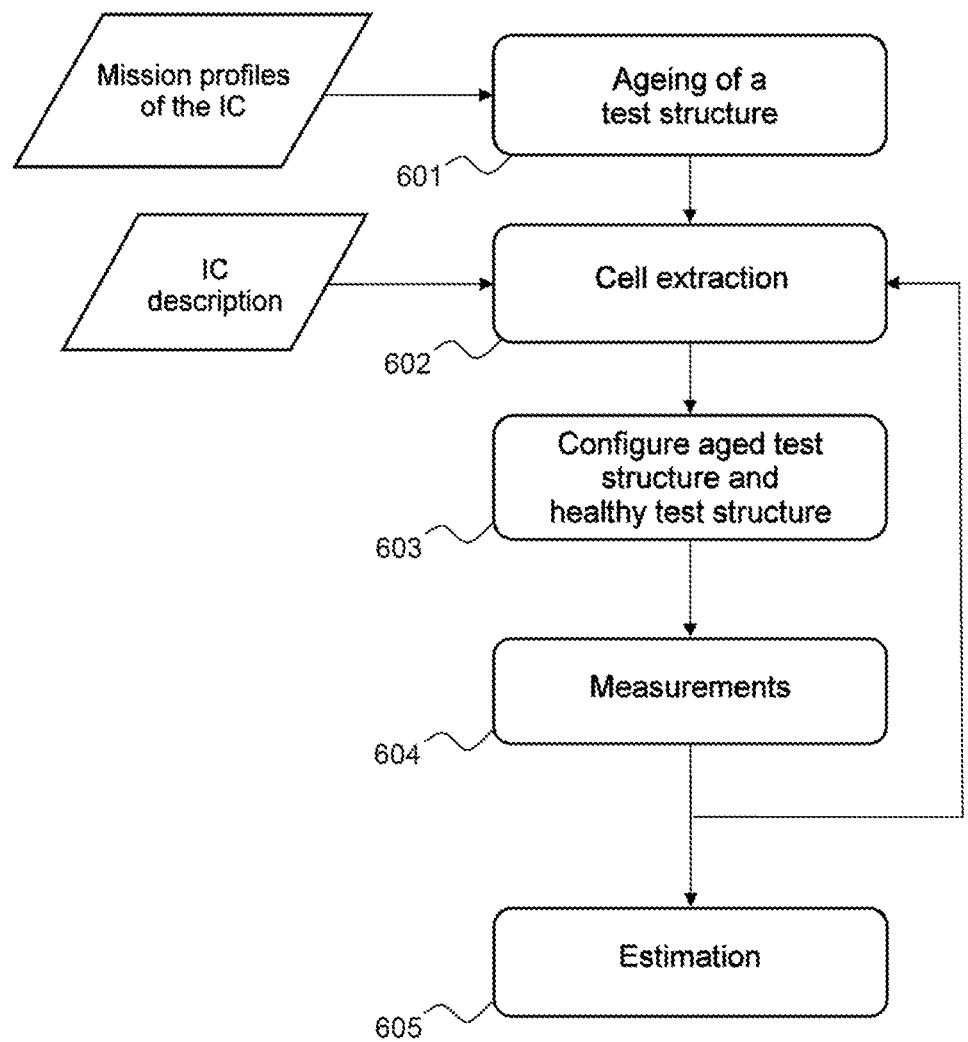
FIG. 6 shows a flowchart describing the steps for implementing a method for testing an integrated circuit according to the invention.

A description is now given, with reference to FIG. 6, of an exemplary embodiment of a method for testing an application-specific integrated circuit, according to the invention, which uses the test system SYS described above.

A first step 601 of the method consists in implementing what is known as a 'stress' protocol in order to accelerate the activation of phenomena linked to the aging of the transistors that form the logic cells of a test structure. This first step 601 is applied to at least one test structure of the characterization integrated circuit but may, advantageously, be applied to a plurality of test structures.

The aim of a stress protocol is to vary at least one physical parameter of a test structure so as to accelerate its aging and obtain a degraded test structure that is liable to reproduce the defects that may occur in a circuit over time.

The physical parameter to be varied may, for example, be chosen from among the following four parameters: the internal temperature of the circuit, the supply voltage of the circuit, the form of a stimulus (signal) injected into the circuit, and the duration for which the circuit is subjected to the variation in one of the above parameters.

A stress protocol may comprise varying one or more physical parameters of the test structure. It may be defined on the basis of a mission profile that is chosen by the user of the system, who may be a design engineer. The mission profile is chosen notably according to test standards that are defined on the basis of the knowledge of the physics of the aging of a circuit.

The stimuli injected at the input of the test structure may notably take three different forms. A first stimulus corresponds to a signal with a constant '0' value that is injected onto the input of all of the cells for a given duration. Another stimulus corresponds to a signal with a constant '1' value. Another stimulus corresponds to a signal alternating between the values '0' and '1'.

Advantageously, the stress protocol 601 is applied to a test structure that is configured according to the layout described in FIG. 4. Thus, a stimulus is able to be injected, via the input terminal of the test structure, directly into each combinatorial cell.

Once step 601 has been applied to a test structure, the latter is artificially degraded or worn.

Step 601 is implemented using the test assembly EDT described in FIG. 1, and in particular using the control device CTR.

The following steps 602, 603, 604, 605 describe a method that makes it possible to estimate a variation, over time, in certain characteristic physical variables of an application-specific integrated circuit that the user wishes to design.

In a first embodiment, the physical variable targeted is a propagation time of a signal in the circuit.

An input point of the method is a description of the targeted application-specific integrated circuit, and more precisely a list of the set of paths implemented by the integrated circuit. A path is a set of logic cells passed through by a signal propagating from an input point of the circuit to an output point of the circuit. A signal may be a rising signal (that is to say a signal transitioning from the '0' state to the '1' state) or a falling signal (that is to say a signal transitioning from the '1' state to the '0' state). An input point of the circuit may be a memory cell or an input terminal. Likewise, an output point of the circuit may be a memory cell or an output terminal. There is at least one path in an integrated circuit. A path is described by the reference of the logic cells that forms it. Each cell has a unique reference that indicates the origin of the manufacturer, the function that is performed, the number of internal transistors, the number of inputs, etc.

The list of the paths is generally obtained using logic synthesis that converts an abstract VHDL or VERILOG description of the integrated circuit into a 'gate' description. The conversion is based on the library of the manufacturer of the circuit. Thus, the description of the paths contains only standard cells from this library.

Conventionally, the method for manufacturing an application-specific integrated circuit comprises:

A—A phase of modeling the circuit (in terms of hardware and software), in which the circuit is modeled at a very high level;

B—A high-level language description phase, after confirmation of the architecture in the modeling phase, in which the implementation of the circuit is described at the register-transfer level (RTL) in the form of sequential elements (registers, flip-flops) and of combinatorial logic elements corresponding to the combinations between the inputs/outputs of the sequential elements and the main inputs/outputs of the circuit; this description, called 'behavioral description', is coded using a high-level programming language (for example VHDL, VERILOG, etc.);

C—A logic simulation phase for simulating the description using a simulator. The simulator simulates, over time, each interconnection signal depending on a previously described input stimulus;

D—A functional verification phase may be implemented in addition to the simulation, notably to simulate longer operating durations, using languages based on modeling by assertion to define the functional properties that the circuit has to verify;

E—A logic synthesis phase in which the behavioral description of the circuit is converted into a structural description at the logic gate level ('netlist'), on the basis of a library of logic gates (for example AND, OR gates, flip-flops, etc.) that is specific to the technology targeted and/or to the founder that will manufacture the circuit. The logic synthesis may be implemented by way of an EDA tool configured to convert the behavioral description into high-level generic structural description language (independently of the library of logic gates) by describing the combinatorial and sequential logic elements in generic form, and then by replacing them with elements from the library of logic gates so as to comply with the conditions pertaining to the features of the circuit (e.g. logic paths of the circuit) with respect to time constraints (operating frequency of the circuit for example) and space constraints (size in terms of silicon). At the end of the logic synthesis, a computer file corresponding to the structural description may be obtained in a chosen format, such as Verilog, VHDL or EDIF. This file corresponding to the integrated circuit represents the instantiation of the gates of the library and their interconnection ('netlist'), F—The circuit may then be manufactured in the plant.

The description of the application-specific circuit may be derived from any one of the descriptions of the circuit that are obtained in the various phases of the design flow. In some embodiments, the description of the application-specific circuit may be a structural description of step E of the application-specific integrated circuit from among the possible descriptions: logic 'netlist' or physical 'netlist'.

Following steps 602, 603 and 604 may be iterated for a plurality of paths extracted from the description of the application-specific integrated circuit. Advantageously, all of the paths are processed in order from the longest to the shortest. The length is determined for example by the number of cells forming this path. As an alternative, the length may also be determined by the estimated propagation time with the aid of software tools and libraries of values supplied by the semiconductor manufacturer.

In one embodiment of the invention, all of the cells forming a path may be transmitted and processed directly by the configuration step 603. This embodiment relates notably to application cases where the characterization integrated circuit is not restricted in terms of dimensions and the application-specific circuit contains few paths.

In another embodiment, in order to limit the dimensions of the characterization integrated circuit, it is possible to process a path by way of an iterative loop using a sliding window comprising a limited number of logic cells.

Step 602 thus consists in extracting, via a selection window, a set of logic cells from the path, starting at the input point of the path. In the following iterations, the selection window is moved towards the output of the path one cell at a time. The selection window contains at least three logic cells. When the three logic cells extracted from the path do not comprise a memory cell at the start of the sequence, a memory cell is added at the start of the window, which then comprises at least four cells. Likewise, when the three logic cells extracted from the path do not comprise a memory cell at the end of the sequence, a memory cell is added at the end of the window, which then comprises at least four cells.

For example, consideration may be given to a path formed of five cells in the following order: A, B, C, D and E. In the first iteration of step 602, the method selects cells A, B and C. In the second iteration of step 602, the method selects cells B, C and D. In the third iteration of step 602, the method selects cells C, D and E. In this example, the cells A and E are memory cells.

Step 603 then consists in configuring at least one degraded test structure by applying step 601 and at least one healthy, that is to say non-degraded, test structure, so that each of these test structures reproduces the layout of cells extracted in the selection window.

Step 603 is executed by the configuration device CONF of the test assembly EDT, which receives the paths of the description of the application-specific integrated circuit via the interface INT.

One exemplary embodiment of step 603 consists in recovering the reference of each extracted cell. The method has for example an associative table T1, called configuration table, which was filled in beforehand when the characterization circuit CAR was designed. The index of the table T1 is the reference of a cell in the characterization circuit. For each cell, the table T1 contains an address that indicates the number of programming inputs EP to be controlled. For each reference, the method looks for the corresponding table entry and then controls the programming inputs found in the table entry so as to activate the corresponding switches. The table T1 is preferably stored in a non-volatile memory of the characterization integrated circuit. For example, the configuration device CONF receives the description of the paths via the interface INT and then reads the table T1 in order to apply the configuration corresponding to the selection window to the chosen test structures.

In a step 604, the method performs measurements on the test structures that are configured via step 603, which comprise at least one degraded test structure and at least one healthy test structure.

If a plurality of degraded test structures are used, each degraded test structure may have been subjected to a stress protocol having different parameters, for example different stimulus forms.

In a first embodiment of the invention, the measurements that are performed relate to propagation time measurements. On each test structure, a propagation time is measured for a signal injected at the input of the group of cells selected in step 602 and measured at the output of this group of cells. Advantageously, the propagation time measurement is performed at the output memory cell. What is known as a 'rising' propagation time is measured, this corresponding to the propagation of a rising signal (changing from the '0' state to the '1' state). What is known as a 'falling' propagation time is also measured, this corresponding to the propagation of a falling signal (changing from the '1' state to the '0' state).

The propagation time in a test structure denotes the time taken by a signal to pass from the input memory cell of the test structure to the output memory cell of the test structure.

One possible way of performing these measurements is based on the technique for searching for the maximum frequency of the test structure or what is known as the 'at-speed' technique.

In the case of the characterization integrated circuit, the aim is to determine the propagation time of a signal propagating through the activated cells. The measurement of this time is based on the use of a clock generator that produces a periodic signal whose frequency is programmable, and of the stimulus generator. Regardless of the contemplated configuration of the test structure, the method requires the activation of a memory cell in each of the two groups of memory cells CM1, CM2.

The remainder of the paragraph describes an exemplary method for measuring the rising propagation time. The steps that are described could be applied in an identical manner to the measurement of the falling propagation time.

The measurement is based on the propagation of a rising transition through the cell situated in the center of the sliding window. In the case of a sliding window comprising three cells extracted from a path, the cell situated in the center of the sliding window is the second cell of the group of three cells.

The measurement may be performed via the following steps:

1. Programming the highest frequency available in the clock generator,
2. Applying a periodic clock signal to the dedicated inputs of the memory cells,
3. Initializing the active memory cells at the value '0',
4. At the first clock edge, a value '0' is applied to the signal input ES of the test structure, and the value '0' is observed on the output S,
5. At the second clock edge, a value '1' is applied to the signal input ES of the test structure, and the value '0' is observed on the output S,
6. At the third clock edge, the value '1' is held on the signal input ES, and the output S may take two possible values:
   a. If the value observed is '1', this means that the propagation time is shorter than the programmed clock period (reciprocal of the frequency). In this case, a higher clock frequency value is chosen using a dichotomy method, and the method is iterated by returning to step 3.
   b. If the value observed is '0', this means that the propagation time is longer than the programmed clock period. In this case, a lower clock frequency value is chosen using a dichotomy method, and the method is iterated by returning to step 3.

The method stops when the difference between the obtained frequency value (Fob) and the current frequency value (Fac) is less than the programming pitch (minimum increment or decrement) of the clock generator. The rising propagation time value (tm) may be obtained using the following formula:

$$tm = \frac{2}{\frac{1}{F_{ac}} + \frac{1}{F_{ob}}}$$

The method described above corresponds to the case of a combinatorial logic cell without inversion. If the output of a cell takes the inverse of the value at input, the values applied to the signal input ES must be complementary ('0' becomes '1' and vice versa).

The invention is not limited to the method described above in order to measure a propagation time. Any other method for measuring a rising and falling propagation time between the input and the output of a test structure is compatible with the invention. In particular, any method that uses delay sensors for detecting the variation in the propagation time of signals between two memory cells may be contemplated.

Steps 602, 603 and 604 are iterated by gradually sliding the selection window by one cell upon each iteration until the end of a path.

At the end of step 604, a set of measurements are obtained that are able to be stored in one or more tables. For example, it is possible to use one table for the degraded test structures and another table for the healthy test structures. Each table may be indexed by the reference of a cell from the group of cells selected in step 602. Each table entry stores all of the measurements that are performed, which comprise at least a rising propagation time value and a falling propagation time value. The table(s) may be stored in a memory of the estimation device EST. In this case, the measurements performed in step 604 via the measurement device MES are transmitted to the estimation device EST via an interface INT.

For each path, one measurement is obtained per cell if a sliding selection window is used.

If a plurality of degraded test structures are used, with different stimulus forms, for each entry the table comprises as many pairs of measurements (rising propagation time, falling propagation time) as there are degraded test structures that are used.

In a step 605, the estimation device EST, which may be implemented by software interfaced with the test system SYS, receives the measurements performed on the various test structures and applies a set of processing operations to these measurements so as to deduce therefrom an estimation a priori of the change over time in the measured physical variable. In the embodiment described in the present case, the physical variable is a propagation time, and the estimation device EST compares the propagation time measurements performed on the degraded test structures, on the one hand, and on the healthy test structures, on the other hand.

The measurements performed on a degraded test structure may be corrected, by way of weighting coefficients, so as to take into account the artificial acceleration of the aging of the test structure and correlate the measurements with values representative of the effect of the aging over a long duration.

The comparison may be performed by calculating the relative variation in the propagation time measured on a degraded test structure with respect to the propagation time measured on a healthy test structure.

When a selection window is used to run through a path of the application-specific integrated circuit, the measurements performed for a plurality of positions of the selection window are aggregated together so as to supply a single final measurement.

By way of example, an estimation of the overall variation in the propagation time may be calculated using the following formula:

$$\Delta t = \frac{\sum t_d(i) - \sum t_s(i)}{\sum t_s(i)}$$

$t_d(i)$ are the (rising or falling) propagation time measurements performed on a degraded test structure,
$t_s(i)$ are the (rising or falling) propagation time measurements performed on a healthy test structure.

If a plurality of degraded test structures are used by injecting a plurality of different stimuli, it is possible to take into account the measurements performed on these degraded test structures in the final estimation calculation in a differential manner.

For example, it is possible to retain only the highest variation from the variations calculated for a plurality of test structures. It is also possible to retain the average of the variations calculated for a plurality of test structures or the average subtracted from the standard deviation, or any other statistical metric.

In another variant embodiment, the choice of the propagation time value that is retained may be guided by the knowledge of the actual activity of the input of a cell G that forms part of the path processed by the method and corresponding to a path in the application-specific integrated circuit.

The actual activity of each cell may be obtained by a logic temporal simulation of the application-specific integrated circuit that is carried out beforehand with input stimuli defined by the user (for example: applications executed on a microprocessor). The simulation relationships are analyzed so as to calculate therefrom the activity of the input of each cell of the application-specific integrated circuit. Two metrics may be used:

the number of switching operations per clock cycle, denoted TR the probabilities of '0' and '1' per clock cycle of a signal, denoted SP0 and SP1 respectively.

Each input of the cell G is associated with a value triplet (TR, SP0 and SP1).

When a cell has at least two inputs, the choice of the triplet for the cell G is that of the input passed through by the path P.

In this variant embodiment, the value that will be retained for the cell G is obtained by an interpolation operation based on all of the values contained, for this cell G, in the table of measurements performed on a plurality of degraded test structures.

Figure 7:
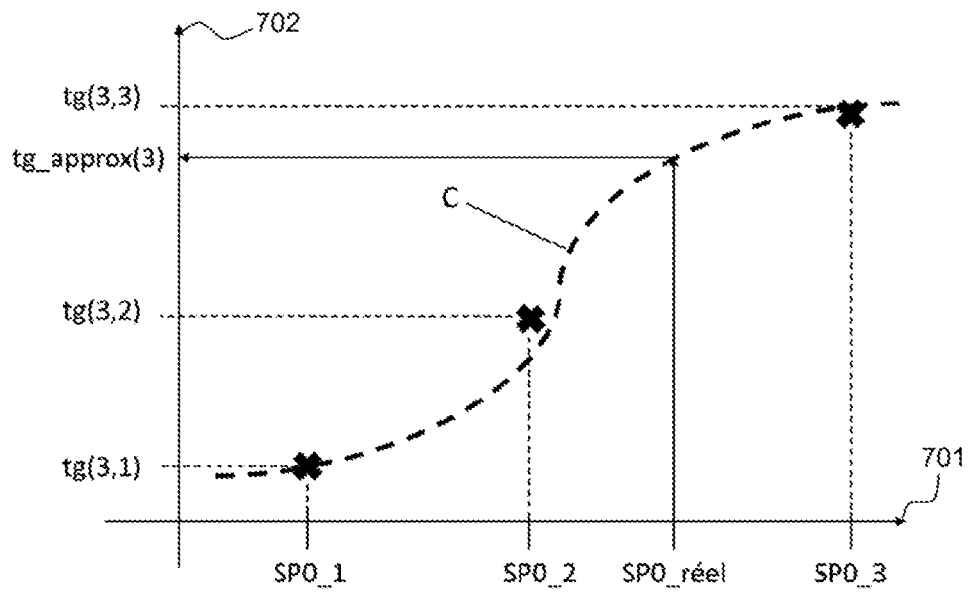
FIG. 7 shows an approximation curve used to estimate a propagation time, in one particular embodiment of the invention.

One exemplary embodiment of the interpolation step is illustrated in FIG. 7, which shows, in a graph, an item of information regarding the activity of the input of a cell G on the abscissa 701, and the propagation time measurements, for this cell G, obtained for a plurality of degraded test structures on the ordinate 702. The activity at the input of the cell is measured by a metric SP0. The activity values SP0_1, SP0_2, SP0_3 are reference values associated with three measurements tg(3,1), tg(3,2), tg(3,3) performed on three different degraded test structures. On the basis of the three points of the curve, statistical theory is used in order to determine the approximation curve C that passes closest to these three points.

Next, on the basis of the activity value SP0_actual actually measured on the input of the cell G, an interpolated measurement tg_approx(3) is obtained.

A description is now given of another embodiment of the invention, in which the measured physical variable may be a current consumed in a logic cell, and not a propagation time.

This embodiment presents a solution for estimating the variation in the current consumed by the circuit over time. The variation is caused by the aging of the cells of the circuit. This solution concerns the static current (when the input of the cell is in a '0' or '1' state) and the dynamic current (when an input switches from the value '0' to '1' and vice versa) consumed by the cells of the application-specific circuit.

Figure 8:
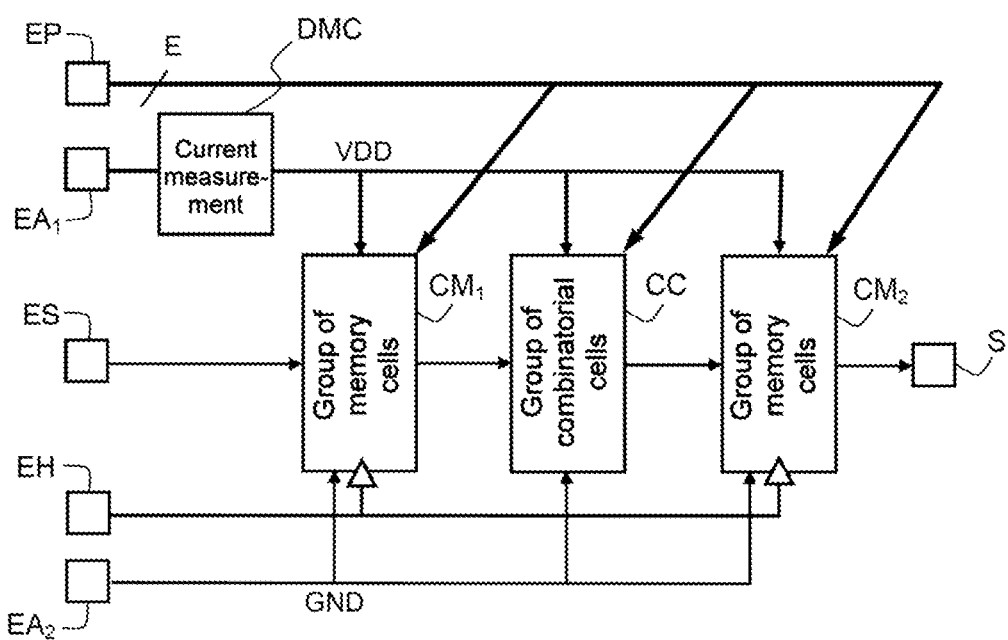
FIG. 8 shows a diagram illustrating a test structure in one variant of the invention applied to the estimation of the variation in the current consumed in the circuit.

To implement this embodiment, the characterization integrated circuit CAR should be modified so as to insert into it a device for measuring the current in each test structure. An exemplary modified test structure according to this variant of the invention is shown in FIG. 8.

The current measurement device DMC may distinguish the current consumed in each test structure separately. To this end, the device DMC is inserted into the power supply rail of each test structure. The power supply rail of each test structure is physically separate from that of the other structures. The measurement of the current of a test structure is the sum of the currents consumed by each active cell in the three groups of cells CM1, CC, CM2.

Furthermore, the test system SYS according to the invention should also be modified so as to insert, into the test assembly EDT, a device DCMC for controlling the measurement of the current consumed in the test structures. The role of this device DCMC is to read and store the current values measured in each test structure separately. The modified test system SYS according to this variant of the invention is shown in FIG. 9.

The measurement step 604 of the method according to this variant embodiment of the invention consists notably in measuring a static current, on the one hand, and in measuring a dynamic current, on the other hand.

The static current is measured by applying a constant signal in the '0' state on the signal input ES of the test structure. The maximum current consumed by the test structure is measured by the measurement device DMC.

The dynamic current is measured by applying, to the signal input ES of the test structure, a signal transitioning from the '0' state to the '1' state. The maximum current consumed during the switching phase of the output of a cell is measured. When a sliding selection window is used, the current is measured in the cell in the center of the window, for example the second cell when the window contains three cells.

The measurements are stored and communicated to the estimation device EST in the same way as for the case of the propagation time measurements.

The calculation of the estimation of the variation in the measured current is identical to that of the calculation described above of the estimation of the variation in the propagation time. In other words, the estimation step 605 is identical between the two variants of the invention.

The invention has the advantage of allowing a user to estimate the reliability of an application-specific integrated circuit by drawing on a test system SYS according to the invention. The configuration and the manipulation of the system may be hidden from the user by virtue of the test assembly EDT.

The test system and method according to the embodiments of the invention have several advantages. In particular, they allow risk analysis and decision-making as early as possible in the development flow, the implementation of the invention being able to use a description of the circuit stemming from the result of the first logic synthesis.

Moreover, they allow accurate estimation of the overall reliability level of the integrated circuit to be produced depending on its implementation and on the mission profile.

Another advantage of the invention is that of allowing an estimation of reliability that is independent of the conditions for accessing the semiconductor manufacturer's confidential data. The invention furthermore guarantees non-disclosure of the confidential information that will be extracted from the test system.

Furthermore, the estimation does not require any particular expertise on the part of the designer in the field of reliability.

The test system and method according to the embodiments of the invention may draw on standard characterization techniques, and apply to any semiconductor technology, regardless of the sources of failures in the transistors.

A person skilled in the art will understand that the test method according to the embodiments may be implemented in numerous ways by hardware, software or a combination of hardware and software, notably in the form of program code that may be distributed in the form of a program product, in numerous forms. In particular, the program code may be distributed using computer-readable media, which may include computer-readable storage media and communication media. The methods described in the present description may notably be implemented in the form of computer program instructions able to be executed by one or more processors in an information technology computer device. These computer program instructions may also be stored in a computer-readable medium.

The invention is not limited to the embodiments described hereinabove by way of non-limiting example. It encompasses all the variant embodiments that may be contemplated by the person skilled in the art. In particular, the invention is not limited to particular types of logic or combinatorial cells in order to produce the characterization integrated circuits.

The invention claimed is:

1. A system for testing an application-specific integrated circuit represented by a description comprising a set of paths linking a plurality of logic cells, the test system comprising a characterization integrated circuit comprising at least two configurable test structures each comprising a plurality of activatable logic cells and a plurality of connectors for activating and interconnecting the logic cells, and a test assembly (EDT) comprising:
   a device for controlling the characterization integrated circuit, configured to vary at least one physical parameter of at least one configurable test structure so as to accelerate its aging so as to obtain at least one degraded test structure,
   an interface for receiving at least one description of an application-specific integrated circuit and extracting at least one path from the description, a device for configuring the characterization integrated circuit so as to activate and interconnect at least one subset of the logic cells of at least one degraded test structure and of at least one non-degraded test structure, so that they each produce a topology identical to at least one portion of an extracted path,
   a measurement control device for performing at least one first measurement of a physical variable on said at least one degraded test structure and at least one second measurement, identical to the first measurement, on said at least one non-degraded test structure.

2. The test system of claim 1, wherein each test structure comprises combinatorial logic cells and memory logic cells.

3. The test system of claim 1, wherein the device for controlling the characterization integrated circuit comprises a device for controlling the temperature of at least one test structure.

4. The test system of claim 1, wherein the device for controlling the characterization integrated circuit comprises a generator of stimuli that are intended to be injected at an input point of at least one test structure.

5. The test system of claim 1, wherein the device for controlling the characterization integrated circuit comprises a device for controlling the supply voltage of at least one test structure.

6. The test system of claim 1, wherein the system furthermore comprises an estimation device (EST) configured to determine, from the measurements supplied by the measurement device, an estimation of a variation over time in at least one physical variable of the application-specific integrated circuit.

7. The test system of claim 1, wherein the physical variable is a propagation time and the measurement control device is able to measure a propagation time of a signal between two memory logic cells.

8. The test system of claim 1, wherein the physical variable is a current that is consumed and the characterization integrated circuit furthermore comprises, for each test structure, a device for measuring the current consumed in the test structure that is able to interact with the measurement control device.

9. A method for testing an application-specific integrated circuit represented by a description comprising a set of paths linking a plurality of logic cells, the method being implemented by way of a test system comprising a characterization integrated circuit comprising at least two configurable test structures each comprising a plurality of activatable logic cells and a plurality of connectors for activating and interconnecting the logic cells and a test assembly, the method comprising the steps of:
   varying at least one physical parameter of at least one configurable test structure so as to accelerate its aging so as to obtain at least one degraded test structure,
   receiving a description of an application-specific integrated circuit and extracting at least one path from the description,
   activating and interconnecting at least one subset of the logic cells of at least one degraded test structure and of at least one non-degraded test structure, so that they each produce a topology identical to at least one portion of an extracted path,
   performing at least one first measurement of a physical variable on said at least one degraded test structure and at least one second measurement, identical to the first measurement, on said at least one non-degraded test structure.

10. The method for testing an application-specific integrated circuit of claim 9, wherein the portion of the path extracted from the description of the application-specific integrated circuit comprises at least three logic cells connected in series.

11. The method for testing an application-specific integrated circuit of claim 10, wherein said subset of activated and interconnected logic cells furthermore comprises:
   an additional memory logic cell connected upstream of the three extracted logic cells if the first logic cell of the portion of the extracted path is not a memory logic cell,
   an additional memory logic cell connected downstream of the three extracted logic cells if the last logic cell of the portion of the extracted path is not a memory logic cell.

12. The method for testing an application-specific integrated circuit of claim 10, wherein at least one physical variable is measured at least on a memory logic cell of said subset.

13. The method for testing an application-specific integrated circuit of claim 12, wherein the method is iterated by varying the portion of the extracted path using a sliding window to cover the entire path.

14. The method for testing an application-specific integrated circuit of claim 9, wherein said physical parameter is selected from among a temperature of the circuit, a supply voltage, and a stimulus injected at the input of the circuit of variable nature and duration.

15. The method for testing an application-specific integrated circuit of claim 9, furthermore comprising estimating a variation over time in at least one physical variable of the application-specific integrated circuit from the measurements performed on said at least one degraded test structure and on said at least one non-degraded test structure.

16. The method for testing an application-specific integrated circuit of claim 15, wherein the estimation comprises calculating the difference between two identical measurements performed on said at least one degraded test structure and on said at least one non-degraded test structure.

17. The method for testing an application-specific integrated circuit of claim 16, wherein the estimation comprises calculating a ratio between a sum of the differences between two identical measurements performed on said at least one degraded test structure and on said at least one non-degraded test structure and a sum of the measurements performed on said at least one non-degraded test structure.

18. The method for testing an application-specific integrated circuit of claim 17, wherein the physical variable is a propagation time or a current that is consumed.

* * * * *